United States Patent
Lee

(10) Patent No.: US 8,125,846 B2
(45) Date of Patent: Feb. 28, 2012

(54) INTERNAL VOLTAGE GENERATING CIRCUIT OF SEMICONDUCTOR MEMORY DEVICE

(75) Inventor: Jun-Phyo Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 219 days.

(21) Appl. No.: 12/689,417

(22) Filed: Jan. 19, 2010

(65) Prior Publication Data

US 2010/0182867 A1 Jul. 22, 2010

(30) Foreign Application Priority Data

Jan. 20, 2009 (KR) ........................ 10-2009-0004704

(51) Int. Cl.
*G11C 5/14* (2006.01)
(52) U.S. Cl. ............... 365/226; 365/189.07; 365/189.09
(58) Field of Classification Search .................. 365/226, 365/189.07, 189.09
See application file for complete search history.

(56) References Cited

U.S. PATENT DOCUMENTS

| | | | | |
|---|---|---|---|---|
| 5,805,508 | A | * | 9/1998 | Tobita ...................... 365/189.09 |
| RE37,593 | E | * | 3/2002 | Etoh et al. ................ 365/189.09 |
| 6,487,136 | B2 | * | 11/2002 | Hidaka ........................ 365/222 |
| 6,683,445 | B2 | | 1/2004 | Park |
| 6,954,103 | B2 | * | 10/2005 | Yamauchi et al. ............ 365/227 |
| 7,123,076 | B2 | | 10/2006 | Hatakeyama et al. |
| 2007/0069802 | A1 | | 3/2007 | Choi et al. |

FOREIGN PATENT DOCUMENTS

| | | |
|---|---|---|
| JP | 2003-051187 | 2/2003 |
| JP | 2005-065178 | 3/2005 |
| KR | 1020030002421 | 1/2003 |
| KR | 1020050020698 | 3/2005 |
| KR | 1020070036557 | 4/2007 |

* cited by examiner

*Primary Examiner* — Tuan T. Nguyen
(74) *Attorney, Agent, or Firm* — F. Chau & Associates, LLC

(57) ABSTRACT

An internal voltage generating circuit of a semiconductor memory device includes a driving current generator that controls the magnitude of a driving current and supplies a controlled driving current in response to signals activated according to an operational mode. A comparison voltage generator receives a reference voltage and an internal power supply voltage, outputs a differentially amplified comparison voltage in response to a voltage difference between the reference voltage and the internal power supply voltage, and operates according to the driving current. A bulk bias controller receives at least two voltages and selectively outputs a voltage as a bulk bias voltage in response to a power-down enable signal, a normal enable signal, and an operating enable signal. An internal voltage driver controls a threshold voltage in response to the bulk bias voltage, controls a current amount in response to the comparison voltage, and outputs the internal power supply voltage.

13 Claims, 3 Drawing Sheets

INTERNAL VOLTAGE GENERATING CIRCUIT OF SEMICONDUCTOR MEMORY DEVICE

CROSS-REFERENCE TO RELATED APPLICATION

This application claims under 35 U.S.C. §119 priority to and the benefit of Korean Patent Application No. 10-2009-0004704, filed on Jan. 20, 2009, the entire contents of which are incorporated by reference herein.

BACKGROUND

1. Technical Field

The present disclosure relates to a semiconductor memory device, and, more particularly, to an internal voltage generating circuit of a semiconductor memory device.

2. Discussion of Related Art

In recent years, typical semiconductor memory devices convert a high external supply voltage into a low internal voltage. The semiconductor memory devices cannot perform reliable operations until an internal power supply voltage is stabilized in a predetermined period of time after application of an external power supply voltage VDD. Accordingly, the semiconductor memory devices require a stable constant voltage power source because the internal power supply voltage is used in main internal circuits, such as a peripheral logic circuit or a memory cell array, and can significantly affect the performance of the entire semiconductor memory device.

In particular, semiconductor memory devices used in portable electronic devices may include both a first internal power supply voltage generating circuit, which operates whenever an external power supply voltage is applied, and a second internal power supply voltage generating circuit, which operates in response to only an active command.

Since semiconductor memory devices can consume a large amount of current in an active mode, the first internal power supply voltage generating circuit needs to be configured to have high current drivability and a fast response speed. By contrast, since the semiconductor memory device consumes only a small amount current in a standby mode, the second internal power supply voltage generating circuit may be configured to have a lower current drivability and a slower response speed than the first internal power supply voltage generating circuit.

Further, semiconductor memory devices may perform various operations, such as an active operation, a read operation, or a precharge operation, in response to various external command signals. Since internal operations of the semiconductor memory devices vary in response to a command signal, their power dissipation also may vary in response to the command signal.

SUMMARY

Exemplary embodiments of the inventive concept provide an internal voltage generating circuit of a semiconductor memory device, which can rapidly restore a stable internal voltage to prevent a malfunction from occurring in the semiconductor memory device when current dissipation varies during internal operations according to various commands. A bulk bias voltage of an internal voltage driver is controlled according to an operational mode to improve current drivability and efficiently reduce current dissipation.

According to an exemplary embodiment of the inventive concept, an internal voltage generating circuit of a semiconductor memory device includes a driving current generator configured to control the magnitude of a driving current and to supply a controlled driving current in response to a power-down enable signal, to a normal enable signal, and to an operating enable signal that are activated according to an operational mode. A comparison voltage generator receives a reference voltage and an internal power supply voltage, outputs a differentially amplified comparison voltage to a second node in response to a voltage of a first node that is determined according to a difference between the reference voltage and the internal power supply voltage, and operates according to the driving current supplied to a third node. A bulk bias controller receives at least two voltages and selectively outputs a voltage among the received voltages as a bulk bias voltage in response to the power-down enable signal, the normal enable signal, and the operating enable signal. An internal voltage driver controls a threshold voltage in response to the bulk bias voltage, controls a current amount in response to the comparison voltage, and outputs the internal power supply voltage to an output node.

The comparison voltage generator may include a first PMOS transistor and a first NMOS transistor connected in series between an external power supply voltage and the third node and having gate terminals connected to the first node and to the reference voltage, respectively, and a second PMOS transistor and a second NMOS transistor connected in series between the external power supply voltage and the third node and having gate terminals connected to the first node and to the internal power supply voltage, respectively. A contact point between the second PMOS transistor and the second NMOS transistor may be connected to the first node.

The internal voltage driver may include a third PMOS transistor that receives the external power supply voltage through a source terminal thereof, that receives the bulk bias voltage through a bulk terminal thereof to control the threshold voltage, and that transmits the external power supply voltage to a drain terminal thereof in response to the comparison voltage applied to a gate terminal thereof.

The driving current generator may include a third NMOS transistor that may have a first terminal and a second terminal connected to the third node and a ground terminal, respectively, and that generates a first driving current during an active period of the normal enable signal; A fourth NMOS transistor may have a first terminal and a second terminal connected to the third node and to the ground terminal, respectively, and may generate a second driving current during an active period of the power-down enable signal. A fifth NMOS transistor may have a first terminal and a second terminal connected to the third node and to the ground terminal, respectively, and may generate a third driving current during an active period of the operating enable signal.

When a voltage level of the internal power supply voltage is varied, the comparison voltage generator may change a voltage level of the comparison voltage to restore the internal power supply voltage to an original voltage level.

The internal voltage driver may drive the internal power supply voltage in response to the comparison voltage.

The bulk bias controller may include: a first transmission gate that is turned on during an active period of the power-down enable signal, and is configured to transmit a higher boost voltage than the external power supply voltage; a second transmission gate that is turned on during an active period of the normal enable signal, and is configured to transmit the external power supply voltage; and a third transmission gate that is turned on during an active period of the operating enable signal, and is configured to transmit a lower operating voltage than the external power supply voltage.

The internal voltage driver may control the threshold voltage to be at a gradually lower level according to an order of activation of the power-down enable signal, the normal enable signal, and the operating enable signal.

The power-down enable signal may be activated in a power-saving mode. The operating enable signal may be activated during a burst read period after a read command is input. The normal enable signal may be activated until a precharge command is input after an active command is input, except during an active period of the operating enable signal.

According to an exemplary embodiment of the inventive concept, an internal voltage generating circuit of a semiconductor memory device includes a driving current generator configured to control the magnitude of a driving current and to supply a controlled driving current in response to a power-down enable signal, to a normal enable signal, and to an operating enable signal that are activated according to an operational mode. A comparison voltage generator receives a reference voltage and an internal power supply voltage, outputs a differentially amplified comparison voltage to a second node in response to a voltage of a first node that is determined according to a difference between the reference voltage and the internal power supply voltage, and operates according to the driving current supplied to a third node. A bulk bias controller receives at least two voltages and selectively outputs a voltage among the received voltages as a bulk bias voltage in response to the power-down enable signal, the normal enable signal, and the operating enable signal. An internal voltage driver controls a threshold voltage in response to the bulk bias voltage, controls a current amount in response to the comparison voltage, and outputs the internal power supply voltage to an output node. The internal voltage driver controls the threshold voltage to be at a gradually lower level according to an order of activation of the power-down enable signal in a power-saving mode, the normal enable signal during a time period after an active command input until a precharge command is input except during an active period of the operating enable signal, and the operating enable signal during a burst read period after a read command is input. A bulk bias voltage in response to the power-down enable signal is greater than a bulk bias voltage in response to the normal enable signal, and a bulk bias voltage in to response to the normal enable signal is greater than a bulk bias voltage in response to the operating enable signal.

According to an exemplary embodiment of the inventive concept an internal voltage generating circuit of a semiconductor memory device is provided. A voltage driving transistor has a threshold voltage that is variable in response to an applied bulk bias voltage. A current generator provides a variable driving current in response to an operating mode signal. A voltage comparator is coupled between the voltage driving transistor and the current generator such that current through the voltage driving transistor is controlled in response to a difference in current between the current through the voltage driving transistor and the variable driving current of the current generator.

During a power-down operating mode the applied bulk bias voltage may be greater than the applied bulk bias voltage during a normal operating mode, and the applied bulk bias voltage during the normal operating mode may be greater than the applied bulk bias voltage during a read operating mode. During the power-down operating mode the variable driving current may be less that the variable driving current during the normal operating mode, and the variable driving current during the normal operating mode may be less than the variable driving current during the read operating mode.

BRIEF DESCRIPTION OF THE DRAWINGS

Exemplary embodiments are described in further detail below with reference to the accompanying drawings.

DETAILED DESCRIPTION OF THE EMBODIMENTS

Various exemplary embodiments will now be described more fully with reference to the accompanying drawings.

Figure 1:
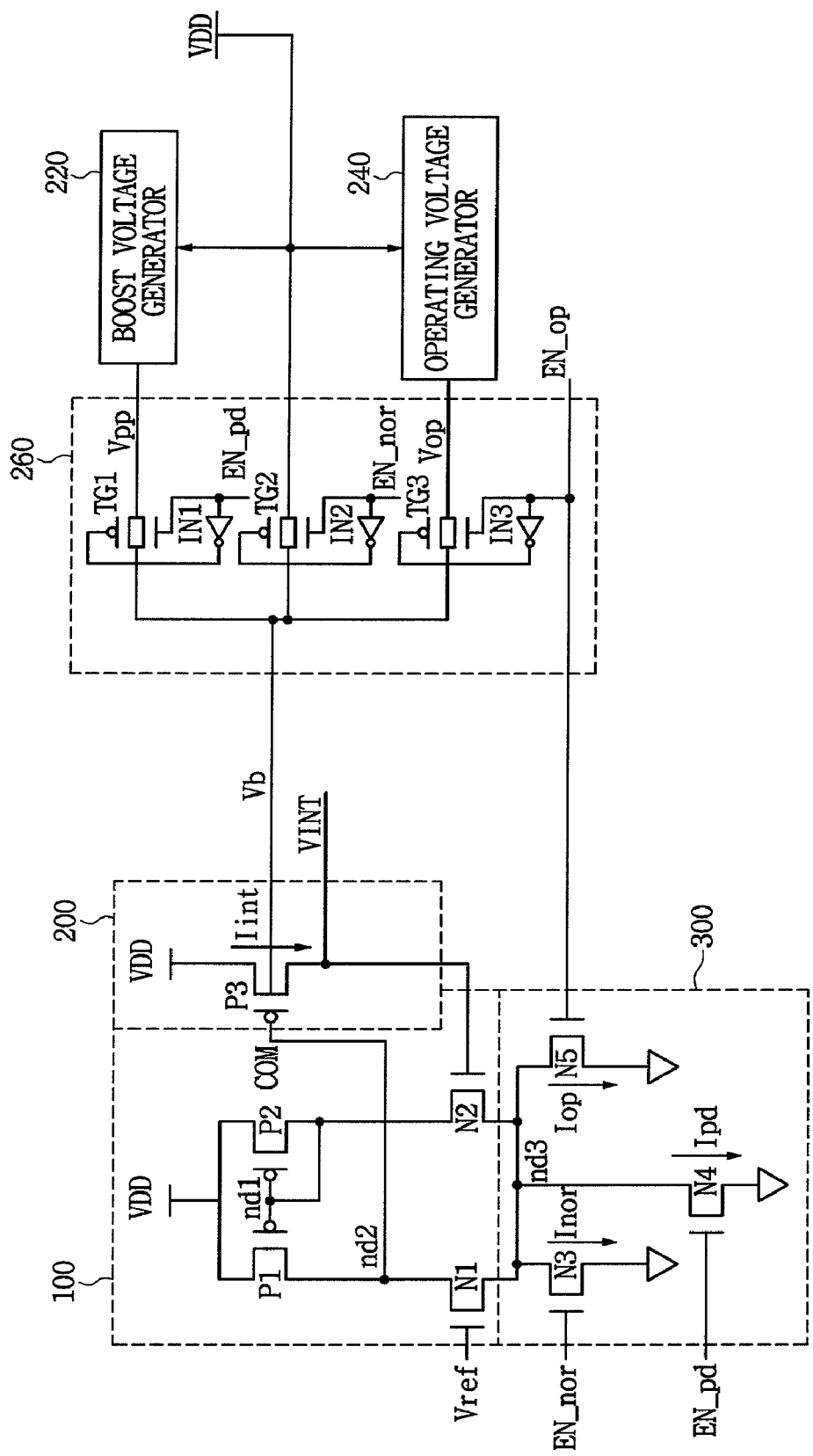
FIG. 1 is a block diagram of an internal voltage generating circuit and peripheral circuits of a semiconductor memory device according to an exemplary embodiment.

FIG. 1 is a block diagram of an internal voltage generating circuit and peripheral circuits of a semiconductor memory device according to exemplary embodiments.

Referring to FIG. 1, the internal voltage generating circuit and the peripheral circuits may include a comparison voltage generator 100, an internal voltage driver 200, a driving current generator 300, a boost voltage generator 220, an operating voltage generator 240, and a bulk bias controller 260.

The comparison voltage generator 100 may include first and second PMOS transistors P1, P2 and first and second NMOS transistors N1, N2. The internal voltage driver 200 may include a third PMOS transistor P3. Also, the driving current generator 300 may include third, fourth, and fifth NMOS transistors N3, N4, N5, and the bulk bias controller 260 may include first, second, and third transmission gates TG1, TG2, TG3 and first, second, and third inverters IN1, IN2, IN3.

An external power supply voltage VDD may be applied in common to source terminals of the respective first and second PMOS transistors P1, P2. The first PMOS transistor P1 may be connected in series to the first NMOS transistor N1, and the second PMOS transistor P2 may be connected in series to the second NMOS transistor N2. Also, source terminals of the first and second NMOS transistors N1, N2 may be connected in common to a ground terminal.

A reference voltage Vref may be applied to a gate terminal of the NMOS transistor N1, and an internal power supply voltage VINT may be applied to a gate terminal of the second NMOS transistor N2. Also, gate terminals of the first and second PMOS transistors P1, P2 may be connected to each other between the second PMOS transistor P2 and the second NMOS transistor N2.

The internal voltage driver 200 may include the third PMOS transistor P3, which may receive an external power supply voltage VDD through a source terminal thereof, receive a bulk bias voltage Vb through a bulk terminal, and control a threshold voltage according to the magnitude of a bulk-source voltage. Also, the third PMOS transistor P3 may transmit the external power supply voltage VDD in response to the comparison voltage applied through a gate terminal thereof.

The driving current generator 300 may include the third through fifth NMOS transistors N3, N4, N5. The third NMOS transistor N3 may be connected in series to the NMOS transistor N1 and turned on in response to a normal enable signal EN_nor. The fourth NMOS transistor N4 may be turned on in response to a power-down enable signal EN_pd. The fifth NMOS transistor N5 may be connected in series to the NMOS transistor N2 and turned on in response to an operating enable signal EN_op.

The bulk bias controller 260 may include the first through third transmission gates TG1, TG2, TG3. The first transmission gate TG1 may be turned on in response to a high-level power-down enable signal EN_pd and transmit a boost voltage Vpp. The second transmission gate TG2 may be turned on in response to a high-level normal enable signal EN_nor and transmit the external power supply voltage VDD. The third transmission gate TG3 may be turned on in response to a high-level operating enable signal EN_op and transmit an operating voltage Vop. Also, the bulk bias controller 260 may further include the first through third inverters IN1, IN2, IN3, which may invert the enable signals EN_pd, EN_nor, EN_op, respectively, and apply the inverted enable signals to gate terminals of PMOS transistors of the corresponding transmission gates TG1, TG2, TG3.

Functions of the respective blocks will now be described with reference to FIG. 1.

The comparison voltage generator 100 may compare the internal power supply voltage VINT with the reference voltage Vref and output a voltage of a second node nd2 as a comparison voltage COM, which is differentially amplified based on a comparison result.

The internal voltage driver 200 may receive the external power supply voltage VDD through a source terminal of the third PMOS transistor P3 and control a source current in response to the comparison voltage COM applied through a gate terminal thereof. Here, a threshold voltage of the third PMOS transistor P3 may depend on the bulk bias voltage Vb, which may vary with an operational mode.

The boost voltage generator 220 may charge-pump the external power supply voltage VDD and generate a boost voltage Vpp having a higher voltage level than the external power supply voltage VDD.

The operating voltage generator 240 may receive the external power supply voltage VDD and generate an operating voltage Vop that is lower than the external power supply voltage VDD by the threshold voltage.

The bulk bias controller 260 may receive the boost voltage Vpp, the external power supply voltage VDD, and the operating voltage Vop and output one of the boost voltage Vpp, the external power supply voltage VDD, and the operating voltage Vop as the bulk bias voltage Vb in response to the power-down enable signal EN_pd, the normal enable signal EN_nor, and the operating enable signal EN_op.

The driving current generator 300 may generate a first driving current Inor in response to the normal enable signal EN_nor applied to the third NMOS transistor N3, generate a second driving current Ipd in response to the power-down enable signal EN_pd applied to the fourth NMOS transistor N4, and generate a third driving current Top in response to the operating enable signal EN_op applied to the NMOS transistor N5. Here, the first driving current Inor may be larger than the second driving current Ipd and smaller than the third driving current Iop.

Figure 2:
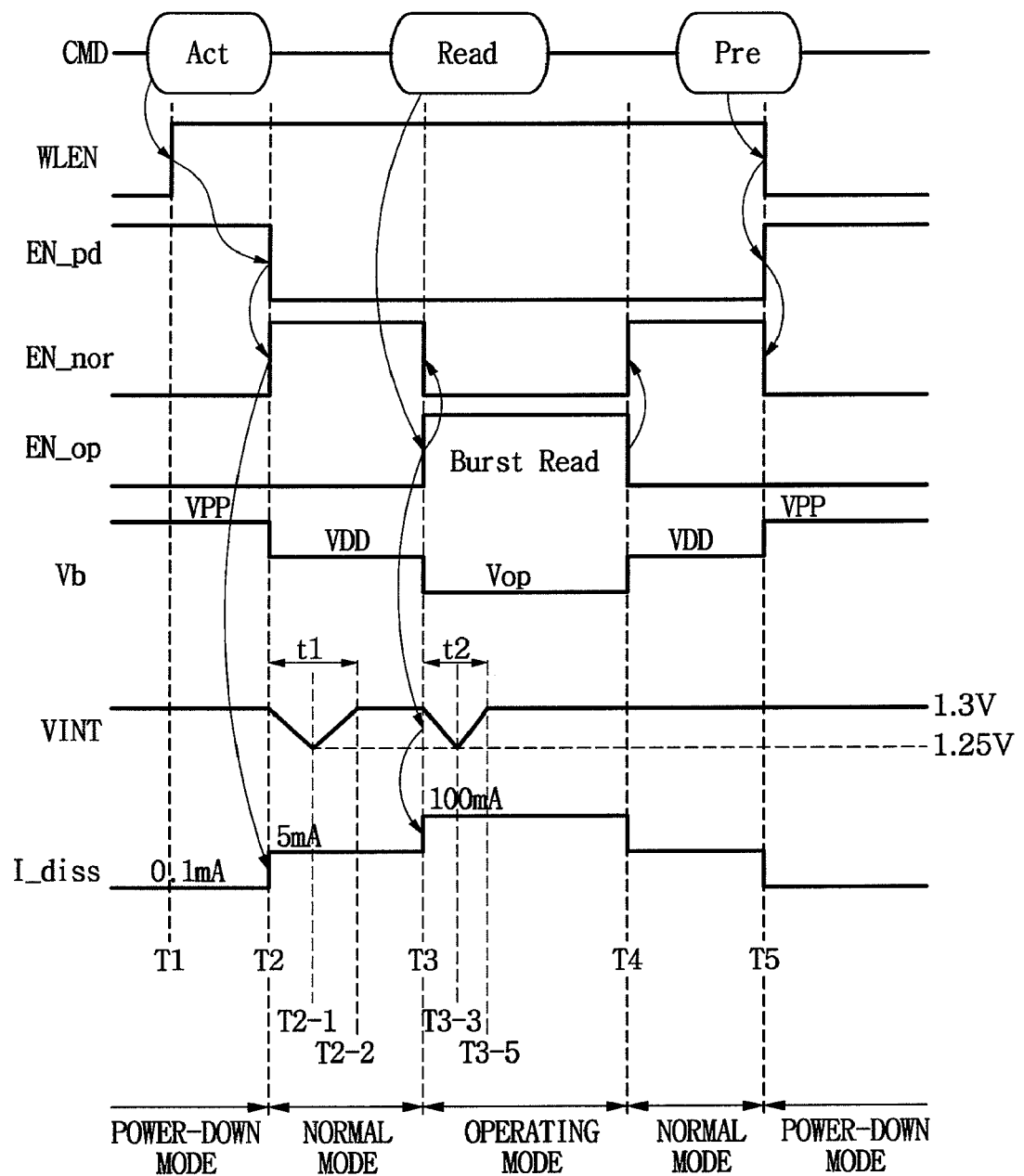
FIG. 2 is a timing diagram illustrating the operation of the internal voltage generating circuit of the semiconductor memory device of FIG. 1.

FIG. 2 is a timing diagram illustrating operation of the internal voltage generating circuit of the semiconductor memory device of FIG. 1. Specifically, FIG. 2 illustrates rises and falls of a command signal CMD, a word line enable signal WLEN, a power-down enable signal EN_pd, a normal enable signal EN_nor, an operating enable signal EN_op, an internal power supply voltage VINT, and a current dissipation I_diss when an active command Act, a read command Read, and a precharge command Pre are sequentially applied to the internal voltage generating circuit.

The word line enable signal WLEN may remain at a low level during an initial period, be activated to a high level at a time point T1 in response to the active command Act, and be inactivated to a low level again at a time point T5 in response to the precharge command Pre.

The power-down enable signal EN_pd may remain at a high level during an initial period, be inactivated to a low level at a time point T2 in response to the active command Act, and be activated to a high level again at the time point T5 in response to the precharge command Pre. That is, the power-down enable signal EN_pd is activated in a standby mode. Here, the power-down enable signal En_pd may be activated in a power-down mode.

The operating enable signal EN_op may remain at a low level during an initial period, be activated to a high level at a time point T3 in response to the read command Read, remain activated during a predetermined burst read period, and be inactivated to a low level again at a time point T4 after the burst read period has elapsed. In other words, the operating enable signal EN_op may be activated during the burst read period. Here, the operating enable signal EN_op may be activated in an operating mode.

The normal enable signal EN_nor may remain at a low level during an initial period, rise to a high level at the time point T2 in response to the active command Act, drop to a low level again at the time point T3 in response to the read command Read, rise to a high level at the time point T4, and drop to a low level again at the time point T5 in response to the precharge command Pre. In other words, the normal enable signal EN_nor may rise to a high level in response to the active command Act, drop to a low level in response to the precharge command Pre, and be activated to a low level during the burst read period in response to the operating enable signal EN_op. Here, the normal enable signal EN_nor may be activated in a normal mode.

The bulk bias voltage Vb may be output at a boost voltage (Vpp) level during an active period of the power-down enable signal EN_pd before the active command Act is applied, and output at an external power supply voltage (VDD) level before and after an active period of the operating enable signal EN_op.

The current dissipation I_diss may be 0.1, 5, and 100 mA in the power-down mode, the normal mode, and the operating mode, respectively.

The internal power supply voltage VINT may remain about 1.3 V during an initial period, start to drop at the time point T2 at which internal circuits of the semiconductor memory device operate, that is, the normal enable signal EN_nor is activated, in response to the active command ACT, and drop to about 1.25 V at a time point T2-1, thereby causing a power dip. Thereafter, the internal power supply voltage VINT may start to rise and be restored to about 1.3 V at a time point T2-2. In other words, the internal power supply voltage VINT may be restored to about 1.3 V after a time period t1 has elapsed since the time point T2. Also, the internal power supply voltage VINT may start to drop again at a time point at which the semiconductor memory device starts a read operation in response to the read command Read, that is, at the time point T3 at which the operating enable signal EN_op is activated, and drop to about 1.25 V at a time point T3-3, thereby causing a power dip. Thereafter, the internal power supply voltage VINT may start to rise and be restored to 1.3 V at a time point T3-5. In other words, the internal power supply voltage VINT may be restored to 1.3 V after a time period t2 has elapsed since the time point T3. Here, the time period t2 may be shorter than the time period t1. It should be noted that the above-described numerical values of the internal power supply voltage VINT are provided according to one exemplary embodiment, but the internal power supply voltage VINT is not limited thereto.

Figure 3:
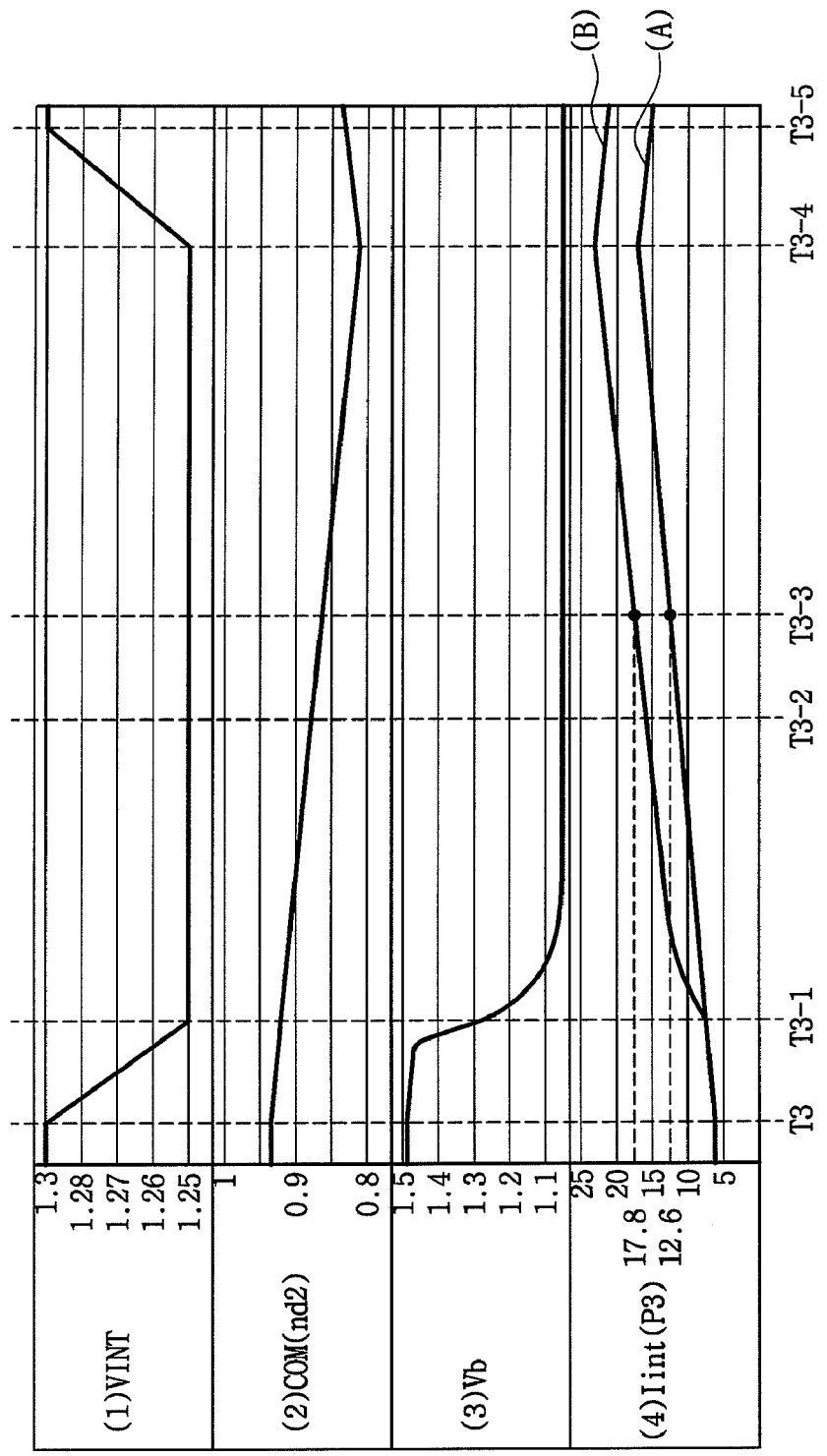
FIG. 3 is a graph depicting simulation results obtained when a power dip occurs in the internal voltage generating circuit of the semiconductor memory device of FIG. 1.

FIG. 3 is a graph of simulation results obtained when a power dip occurs in the internal voltage generating circuit of the semiconductor memory device of FIG. 1, which enlarges a time interval between time points T3 and T3-5 of an operating mode period of FIG. 2.

Referring to FIG. 3, a first curve (1) shows a variation in the internal power supply voltage VINT over time, a second curve (2) shows a variation in the comparison voltage COM of the comparison voltage generator 100 over time, a third curve (3) shows a variation in the bulk bias voltage Vb of the bulk bias controller 260 over time, and a fourth curve (4) shows a variation in the internal current Iint supplied to the internal voltage driver 200 over time according to a simulation (A) for a conventional interval voltage generating circuit and a simulation (B) according to exemplary embodiments of the inventive concept of the present application.

When the internal power supply voltage VINT remained 1.3 V during an initial period and sharply dropped at the time point T3 as shown in the first curve (1), the comparison voltage COM started to gradually drop at the time point T3 as shown in the second curve (2).

In addition, when the bulk bias voltage Vb remained 1.5 V during an initial period and started to drop at the time point T3 as shown in the third curve (3), the internal current Iint gradually rose as shown in the fourth curve (4). When the bulk bias voltage Vb sharply dropped at the time point T3-1 as shown in the third curve (3), the internal current Tint instantaneously rose and then gently increased as shown in the fourth curve (4).

In the simulation (A), even when the bulk bias voltage Vb sharply dropped at the time point T3-1, the internal current Iint increased at a constant rate. However, by comparison, in the simulation (B) according to an exemplary embodiment of the inventive concept, the internal current Iint sharply rose at the time point T3-1 and then slowly increased. Thus, the internal current Iint measured in the simulation (A) was about 12.6 mA at time point T3-3, while the internal current Iint measured in the simulation (B) according to the exemplary embodiment was about 17.8 mA at time point T3-3, which was higher than 12.6 mA by 5.2 mA.

The operation of the internal voltage generating circuit of the semiconductor memory device according to the exemplary embodiments will now be described with reference to FIGS. 1 through 3.

When the internal circuits of the semiconductor memory device start to operate, dissipation of the internal current Iint may increase instantaneously, so that a voltage level of the internal power supply voltage VINT can become instantaneously lower than that of the reference voltage Vref. In other words, a power dip may occur.

In this case, the internal voltage generating circuit may detect a difference between a reduced internal power supply voltage VINT and the reference voltage Vref and restore the internal power supply voltage VINT to a reference voltage (Vref) level. In this case, a voltage restoration time to restore the internal power supply voltage VINT to an original value should be as short as possible to prevent a malfunction in the semiconductor memory device.

To begin with, in the power-down mode in which the internal voltage generating circuit of the semiconductor memory device performs no operation (since the internal circuits connected to the internal voltage generating circuit do not use the internal voltage VINT), the internal voltage VINT may be maintained at a constant level.

Thus, the comparison voltage generator 100 may also maintain the comparison voltage COM at the same level as before. The bulk bias controller 260 outputs a boost voltage Vpp, which is higher than the external power supply voltage VDD, through the first transmission gate TG1 in response to the power-mode enable signal EN_pd that is activated to a high level. Thus, the threshold voltage of the PMOS transistor P3 of the internal voltage driver 200 may be further increased, thereby reducing leakage current that may flow through the PMOS transistor P3. In other words, when the internal voltage driver 200 receives the boost voltage Vpp from the bulk bias controller 260 in the power-down mode, the bulk-source voltage of the PMOS transistor P3 may become a positive value. Thus, due to an intrinsic back-bias characteristic of a transistor, as the threshold voltage increases, the internal current Iint decreases.

Next, when the active command Act is applied, the internal circuits connected to the internal voltage generating circuit may enter the normal mode and start operations in response to the internal voltage VINT. In this case, as shown in FIG. 2, the internal voltage VINT may drop instantaneously at a time point T2 due to power dissipation of the internal circuits.

When the active command Act is applied, as shown in FIG. 2, the word line enable signal WLEN may be enabled to a high level at the time point T1, and the normal enable signal EN_nor may be enabled after a predetermined period has elapsed. In this case, since direct-current (DC) voltage generators start to operate and dissipate large currents, the internal power supply voltage VINT may sharply drop at the time point T2. Meanwhile, the NMOS transistor N3 of the driving current generator 300 may be turned on in response to the enabled normal enable signal EN_nor and generate a first driving current Inor. In contrast, the NMOS transistor N4 of the driving current generator 300 may be turned off in response to the disabled power-down enable signal EN_pd.

The comparison voltage generator 100 may receive the reference voltage Vref and the dropped internal power supply voltage VINT, differentially amplify the difference between the reference voltage Vref and the dropped internal power supply voltage VINT, and output the comparison voltage COM to the second node nd2. In this case, a sink current flowing through the NMOS transistor N2 may be reduced due to the instantaneously dropped voltage level of the internal power supply voltage VINT, so that a voltage of the first node nd1 may rise to a high level. Thus, the PMOS transistor P1 may be slightly turned on in response to the voltage of the first node nd1, thereby slowing the reduction of the comparison voltage COM. As a result, since the PMOS transistor P3 may be turned on to a larger extent, the supplied internal current Iint may increase, and thus the internal power supply voltage VINT, which was reduced to 1.25 V, may be restored to 1.3 V at the time point T2-2. That is, the internal power supply voltage VINT, which has dropped due to an entry into the normal mode, may be restored to an original value within a period of time t1.

Meanwhile, the bulk bias controller 260 may output the external power supply voltage VDD through the second transmission gate TG2 in response to the normal enable signal EN_nor that is activated in the normal mode. Thus, the bulk bias voltage Vb applied to the third PMOS transistor P3 may make the transition from a level of the boost voltage Vpp to a level of the external power supply voltage VDD so that a threshold voltage of the PMOS transistor P3 may become lower than in the power mode. That is, when the internal voltage driver 200 receives the external power supply voltage VDD in the normal mode, a bulk-source voltage of the third PMOS transistor P3 may be changed from a positive value to "0," and thus the threshold voltage of the third PMOS transistor P3 may be reduced within a small range. As a result, the third PMOS transistor P3 may be turned on to an intermediate extent, and the internal power supply voltage VINT may slowly increase.

As described above, the third PMOS transistor P3 of the internal voltage driver 200 may receive the bulk bias voltage Vb through the bulk terminal, control the threshold voltage according to the magnitude of the bulk-source voltage, and control the magnitude of the internal power supply voltage VINT in response to the comparison voltage COM.

Next, the operating mode may start in response to the read command Read. In the operating mode, since the internal circuits of the semiconductor memory device may require more power, a large internal current Iint may be instantaneously supplied to the internal circuits. Thus, when the operating enable signal EN_op is activated, the internal power supply voltage VINT may drop instantaneously.

In this case, the bulk bias controller 260 may output an operating voltage Vop, which is lower than the external power supply voltage VDD, through the third transmission gate TG3 in response to the activated operating enable signal EN_op. Thus, the threshold voltage of the third PMOS transistor P3 of the internal voltage driver 200 may become lower than in the normal mode.

Meanwhile, in the comparison voltage generator 100, the NMOS transistor N2 may be slightly turned on due to the instantaneously reduced internal power supply voltage VINT, thereby reducing a sink current flowing through the NMOS transistor N2. Thus, the voltage of the first node nd1 may rise to a high level, and the PMOS transistor P1 may also be slightly turned on in response to the voltage of the first node nd1, so that the comparison voltage COM may slowly drop as shown in FIG. 3. In this case, since the PMOS transistor P3 having a lower threshold voltage is turned on to a larger extent than in the normal mode in response to the comparison voltage COM, as shown in FIG. 2, a restoration time period t2 to restore the instantaneously dropped internal power supply voltage VINT to an original voltage level may be shorter than a restoration time period t1 taken in the normal mode. This is because the comparison voltage generator 100 is more responsive in the operating mode than in the normal mode.

Also, when the internal power supply voltage VINT drops, the third NMOS transistor N5 of the comparison voltage generator 100 may be turned on in response to the operating enable signal EN_op at the time point T3 so that a third driving current Iop larger than the first driving current Inor supplied in the normal mode may flow to the ground terminal.

When the internal voltage driver 200 receives the operating voltage Vop from the bulk bias controller 260 in the operating mode, the bulk-source voltage of the PMOS transistor P3 may become a negative value so that the threshold voltage of the PMOS transistor P3 may greatly drop. Thus, the PMOS transistor P3 may be turned on to a large extent, so that even if a power dip occurs in the internal power supply voltage VINT, the internal power supply voltage VINT may be restored to an original voltage level faster than when a power dip occurs in the normal mode.

Referring to the curves (3) and (4) of FIG. 3, the bulk bias voltage Vb may sharply drop between the time point T3 and the time point T3-1 so that the internal current Iint may sharply increase for a predetermined time period from the time point T3-1. Actually, the internal current Iint supplied to the internal voltage driver 200, which was measured at the time point T3-3 in the simulation B according to the exemplary embodiments, was 17.8 mA, which was higher than an internal current Iint of 12.6 mA measured in the simulation A, by 5.2 mA.

In this case, the internal current Iint may function to control the responsivity of the comparison voltage generator 100. Thus, as the internal current Iint increases, the comparison voltage generator 100 may become more responsive, and as the internal current Iint decreases, the comparison voltage generator 100 may become less responsive.

Meanwhile, the driving current generator 300 may generate a second driving current Ipd in response to the power-down enable signal EN_pd and generate a third driving current Top in response to the operating enable signal EN_op.

Specifically, when the power-down enable signal EN_pd is activated, the driving current generator 300 may detect the power-down mode and generate the second driving current Ipd, which is the smallest of the first through third driving currents Inor, Ipd, Iop. When the normal enable signal EN_nor is activated, the driving current generator 300 may detect the normal mode and generate the first driving current Inor, which is intermediate between the second and third driving currents Ipd and Iop. Also, when the operating enable signal EN_op is activated, the driving current generator 300 may detect a period in which operating characteristics of the comparison voltage generator 100 and the internal voltage driver 200 are to be improved and generate the third driving current Top, which is largest of the first through third driving currents Inor, Ipd, Iop.

Accordingly, referring to the simulation result, the current dissipation I_diss of the comparison voltage generator 100 may be a second driving current Ipd of about 1 uA in the power-down mode, which is a power-saving period, and a first driving current Inor of about 10 uA in the normal mode, which is an intermediate current dissipation period. That is, when the internal voltage driver 200 receives the boost voltage Vpp from the bulk bias controller 260 in the power-down mode, the threshold voltage of the PMOS transistor P3 may increase, so that the internal power supply voltage VINT may drop to a low level. Thus, the NMOS transistor N2 may be turned on to a small extent, thereby reducing a sink current flowing through the NMOS transistor N2. As a result, current consumed by the NMOS transistor N4 of the driving current generator 300 may be lessened, thereby enabling a reduction in current dissipation in the power-down mode.

Meanwhile, the current dissipation I_diss of the comparison voltage generator 100 may be a third driving current Top of about 300 uA in the operating mode, which is a responsivity improvement period. That is, when the internal voltage driver 200 receives the operating voltage Vop from the bulk bias controller 260 in the operating mode, the internal power supply voltage VINT may increase, thereby causing a rise in a sink current flowing through the NMOS transistor N2. As a result, although current consumed by the NMOS transistors N3, N4, N5 of the driving current generator 300 increases, the internal power supply voltage VINT may be rapidly restored to an original voltage level, so that the comparison voltage generator 100 may become more responsive in the operating mode.

Therefore, the internal voltage generating circuit of the semiconductor memory device according to the exemplary embodiment may control the bulk bias voltage Vb applied to the PMOS transistor P3 of the internal voltage driver 200 according to an operational mode. Thus, when the internal current Iint flowing through the PMOS transistor P3 drops instantaneously in the normal mode or operating mode, the internal voltage generating circuit may rapidly restore the internal current Iint to an original voltage level. Accordingly, the internal voltage generating circuit of the semiconductor memory device may reduce DC current dissipation and improve operating characteristics.

As described above, an internal voltage generating circuit of a semiconductor memory device can reduce a driving current in a power-down mode to lessen DC current dissipation. Furthermore, when an internal power supply voltage drops instantaneously in an operating mode, the internal voltage generating circuit can rapidly restore the internal power supply voltage to an original voltage level, thereby increasing the responsivity of the semiconductor memory device.

While exemplary embodiments have been disclosed herein, it should be understood that other variations may be possible. Such variations are not to be regarded as a departure from the spirit and scope of the exemplary embodiments of the present application, and all such modifications that would be apparent to one skilled in the art are intended to be included within the scope of the following claims.

What is claimed is:

1. An internal voltage generating circuit of a semiconductor memory device, comprising:
    a driving current generator configured to control the magnitude of a driving current and to supply a controlled driving current in response to a power-down enable signal, to a normal enable signal, and to an operating enable signal that are activated according to an operational mode;
    a comparison voltage generator configured to receive a reference voltage and an internal power supply voltage, to output a differentially amplified comparison voltage to a second node in response to a voltage of a first node that is determined according to a difference between the reference voltage and the internal power supply voltage, and to operate according to the driving current supplied to a third node;
    a bulk bias controller configured to receive at least two voltages and to selectively output a voltage among the received voltages as a bulk bias voltage in response to the power-down enable signal, the normal enable signal, and the operating enable signal; and
    an internal voltage driver configured to control a threshold voltage in response to the bulk bias voltage, to control a current amount in response to the comparison voltage, and to output the internal power supply voltage to an output node.

2. The circuit of claim 1, wherein the comparison voltage generator comprises:
    a first PMOS transistor and a first NMOS transistor connected in series between an external power supply voltage and the third node and having gate terminals connected to the first node and to the reference voltage, respectively; and
    a second PMOS transistor and a second NMOS transistor connected in series between the external power supply voltage and the third node and having gate terminals connected to the first node and to the internal power supply voltage, respectively,
    wherein a contact point between the second PMOS transistor and the second NMOS transistor is connected to the first node.

3. The circuit of claim 1, wherein the internal voltage driver comprises a third PMOS transistor configured to receive the external power supply voltage through a source terminal thereof, to receive the bulk bias voltage through a bulk terminal thereof to control the threshold voltage, and to transmit the external power supply voltage to a drain terminal thereof in response to the comparison voltage applied to a gate terminal thereof.

4. The circuit of claim 1, wherein the driving current generator comprises:
    a third NMOS transistor configured to have a first terminal and a second terminal connected to the third node and a ground terminal, respectively, and to generate a first driving current during an active period of the normal enable signal;
    a fourth NMOS transistor configured to have a first terminal and a second terminal connected to the third node and to the ground terminal, respectively, and to generate a second driving current during an active period of the power-down enable signal; and
    a fifth NMOS transistor configured to have a first terminal and a second terminal connected to the third node and to the ground terminal, respectively, and to generate a third driving current during an active period of the operating enable signal.

5. The circuit of claim 1, wherein when a voltage level of the internal power supply voltage is varied, the comparison voltage generator changes a voltage level of the comparison voltage to restore the internal power supply voltage to an original voltage level.

6. The circuit of claim 5, wherein the internal voltage driver drives the internal power supply voltage in response to the comparison voltage.

7. The circuit of claim 1, wherein the bulk bias controller comprises:
    a first transmission gate that is turned on during an active period of the power-down enable signal, and is configured to transmit a higher boost voltage than the external power supply voltage;
    a second transmission gate that is turned on during an active period of the normal enable signal, and is configured to transmit the external power supply voltage; and
    a third transmission gate that is turned on during an active period of the operating enable signal, and is configured to transmit a lower operating voltage than the external power supply voltage.

8. The circuit of claim 1, wherein the internal voltage driver controls the threshold voltage to be at a gradually lower level according to an order of activation of the power-down enable signal, the normal enable signal, and the operating enable signal.

9. The circuit of claim 1, wherein:
    the power-down enable signal is activated in a power-saving mode,
    the operating enable signal is activated during a burst read period after a read command is input, and
    the normal enable signal is activated until a precharge command is input after an active command is input, except during an active period of the operating enable signal.

10. The circuit of claim 1, wherein the bulk bias voltage in response to the power-down enable signal is greater than the bulk bias voltage in response to the normal enable signal, and the bulk bias voltage in response to the normal enable signal is greater than the bulk bias voltage in response to the operating enable signal.

11. An internal voltage generating circuit of a semiconductor memory device, comprising:
    a driving current generator configured to control the magnitude of a driving current and to supply a controlled driving current in response to a power-down enable signal, to a normal enable signal, and to an operating enable signal that are activated according to an operational mode;

a comparison voltage generator configured to receive a reference voltage and an internal power supply voltage, to output a differentially amplified comparison voltage to a second node in response to a voltage of a first node that is determined according to a difference between the reference voltage and the internal power supply voltage, and to operate according to the driving current supplied to a third node;

a bulk bias controller configured to receive at least two voltages and to selectively output a voltage among the received voltages as a bulk bias voltage in response to the power-down enable signal, the normal enable signal, and the operating enable signal; and an internal voltage driver configured to control a threshold voltage in response to the bulk bias voltage, to control a current amount in response to the comparison voltage, and to output the internal power supply voltage to an output node, wherein the internal voltage driver controls the threshold voltage to be at a gradually lower level according to an order of activation of the power-down enable signal in a power-saving mode, the normal enable signal during a time period after an active command input until a precharge command is input except during an active period of the operating enable signal, and the operating enable signal during a burst read period after a read command is input, and wherein a bulk bias voltage in response to the power-down enable signal is greater than a bulk bias voltage in response to the normal enable signal, and a bulk bias voltage in response to the normal enable signal is greater than a bulk bias voltage in response to the operating enable signal.

12. An internal voltage generating circuit of a semiconductor memory device, comprising:

a voltage driving transistor, having a threshold voltage that is variable in response to an applied bulk bias voltage;

a current generator that provides a variable driving current in response to an operating mode signal; and a voltage comparator coupled between the voltage driving transistor and the current generator such that current through the voltage driving transistor is controlled in response to a difference in current between the current through the voltage driving transistor and the variable driving current of the current generator.

13. The internal voltage generating circuit of claim 12, wherein during a power-down operating mode the applied bulk bias voltage is greater than the applied bulk bias voltage during a normal operating mode, and the applied bulk bias voltage during the normal operating mode is greater than the applied bulk bias voltage during a read operating mode, and wherein during the power-down operating mode the variable driving current is less that the variable driving current during the normal operating mode, and the variable driving current during the normal operating mode is less than the variable driving current during the read operating mode.

* * * * *